US008542050B2

(12) United States Patent
Kim et al.

(10) Patent No.: US 8,542,050 B2
(45) Date of Patent: Sep. 24, 2013

(54) MINIMIZED LINE SKEW GENERATOR

(75) Inventors: Jae-Hyeong Kim, San Ramon, CA (US); Patrick T. Chuang, Cupertino, CA (US); Chungji Lu, Sunnyvale, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 1140 days.

(21) Appl. No.: 11/410,352

(22) Filed: Apr. 24, 2006

(65) Prior Publication Data
US 2007/0096790 A1 May 3, 2007

Related U.S. Application Data

(60) Provisional application No. 60/731,393, filed on Oct. 28, 2005.

(51) Int. Cl.
*H03K 3/00* (2006.01)

(52) U.S. Cl.
USPC .......................................... 327/291; 327/295

(58) Field of Classification Search
USPC .................................................. 327/291, 295
See application file for complete search history.

(56) References Cited

U.S. PATENT DOCUMENTS

| 5,915,107 | A | 6/1999 | Maley et al. ............... 395/551 |
| 6,163,864 | A | 12/2000 | Bhavsar et al. ............ 714/727 |
| 6,642,763 | B2 | 11/2003 | Dike .............................. 327/202 |
| 6,760,857 | B1 | 7/2004 | Lau et al. ...................... 713/500 |
| 6,775,342 | B1 | 8/2004 | Young et al. ................. 375/371 |
| 6,836,144 | B1 | 12/2004 | Bui et al. ....................... 326/32 |
| 6,880,117 | B2 | 4/2005 | Tseng et al. |
| 6,943,599 | B2 | 9/2005 | Ngo ............................... 327/156 |
| 7,093,177 | B2 | 8/2006 | West et al. .................... 714/738 |
| 7,202,724 | B2 | 4/2007 | Kim ............................... 327/218 |
| 7,219,283 | B2 | 5/2007 | Whetsel ........................ 714/727 |
| 7,228,476 | B2 | 6/2007 | Scipioni et al. .............. 714/733 |
| 7,242,737 | B2 | 7/2007 | Lake et al. .................... 375/372 |
| 7,253,656 | B2 | 8/2007 | Costa et al. .................... 326/30 |
| 7,254,793 | B2 | 8/2007 | Chen et al. ...................... 716/5 |
| 7,308,592 | B2 | 12/2007 | Schmunkamp et al. ...... 713/400 |
| 7,317,773 | B2 | 1/2008 | Young et al. .................. 375/354 |
| 2001/0046172 | A1 | 11/2001 | Dietrich et al. .......... 365/230.06 |
| 2002/0047739 | A1* | 4/2002 | Mace ............................ 327/291 |
| 2002/0170003 | A1 | 11/2002 | Hirabayashi ................... 714/42 |
| 2003/0043926 | A1 | 3/2003 | Terashima et al. ............ 375/257 |
| 2005/0024105 | A1 | 2/2005 | Agrawal et al. ............... 327/156 |
| 2005/0190640 | A1 | 9/2005 | Braceras et al. .............. 365/233 |
| 2007/0300111 | A1 | 12/2007 | Rausch et al. ................ 714/731 |

FOREIGN PATENT DOCUMENTS

| JP | 10177791 A | 6/1998 |
| JP | 20020216479 A | 8/2002 |
| WO | 92/04774 A1 | 3/1992 |

* cited by examiner

*Primary Examiner* — Lincoln Donovan
*Assistant Examiner* — Diana J Cheng
(74) *Attorney, Agent, or Firm* — Sony Corporation

(57) ABSTRACT

The system described herein provides a minimized skew generator that has very small timing variation. Four phase signals are compressed into one signal including the four phase information. Therefore, the signal with all of the phase information travels on the same line, thus avoiding the concerns of skewing based on different sizes of metal lines. Since there are two rising edges and two falling edges within one signal, an enable line is utilized to select between the first and second, rising and falling edges. With this processing, the system has only one critical signal output, thus requiring only one signal line. Skewing of the signals and the amount of power required are both reduced.

39 Claims, 7 Drawing Sheets

MINIMIZED LINE SKEW GENERATOR

RELATED APPLICATION(S)

This Patent Application claims priority under 35 U.S.C. §119(e) of the co-owned U.S. Provisional Patent Application, Ser. No. 60/731,393, filed Oct. 28, 2005, and entitled "Minimized—line skew generator on DLL 4 phase signals." The Provisional Patent Application, Ser. No. 60/731,393, filed Oct. 28, 2005, and entitled "Minimized—line skew generator on DLL 4 phase signals." is also hereby incorporated by reference in its entirety.

FIELD OF THE INVENTION

The present invention relates to the field of clock circuits. More specifically, the present invention relates to minimizing line skew in memory.

BACKGROUND OF THE INVENTION

Synchronous digital systems, including memory, rely on one or more clock signals to synchronize elements across the system. Typically, one or more clock signals are distributed across the system on one or more clock lines. However, due to variations in the width and height of metal lines, the rising edges of a clock signal in different parts of the system are not always synchronized. The time difference between a rising or falling edge in one part of the system with the corresponding rising or falling edge in another part of the system is referred to as "timing skew" or "clock skew." In double data rate memory, timing skew is very important.

Furthermore, when the chip density becomes larger, routing metal lines are run longer distances which creates more opportunities for larger skew.

Clock skew causes digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

Delay lock loops are used in digital systems to minimize clock skew. Delay lock loops typically use delay elements to synchronize the active edges of a reference clock signal in one part of the system with a feedback clock signal from a second part of the system.

FIG. 1A illustrates a block diagram of a delayed lock loop of the prior art. A reference clock signal 100 is received at an input buffer 102. The input buffer 102 stores data signals including the clock signal 100 temporarily. After a time t, the input buffer sends the data to delay cells 104 and a charge pump/phase detector 106. The delay cells 104 delay input clock signals as needed. The charge pump/phase detector 106 compares the phase of a local oscillator (not shown) with the reference clock signal 100. The charge pump/phase detector 106 also ensures that the local oscillator (not shown) stays in the same frequency as the reference clock signal 100 by delivering positive or negative charge pulses depending on whether the reference clock signal 100 leads or lags the local oscillator (not shown). The delay cells 104 and the charge pump/phase detector 106 function together to ensure the signals have the correct phase and frequency. A driver 108 then receives the modified signals and drives the signals to the respective output lines C_0 110, C_90 112, C_180 114 and C_270 116. Since there are four separate output lines corresponding to each phase signal and each line could have varying dimensions, it is possible for there to be a skew 118 in the data signals.

FIG. 1B illustrates a timing diagram of the prior art. As is shown, there are four separate signals with different phases: 0 degree, 90 degree, 180 degree and 270 degree. Since the signals are on their own respective wires, it is possible for skewing 118 to occur as denoted by the left and right arrows.

FIG. 2 illustrates an example of an internal view of a memory in a center aligned scheme. Within the memory is a delayed lock loop 200. As described above, the delayed lock loop functions to maintain a phase for the different signals and then sends the signals to their respective lines, 110, 112, 114 and 116 (FIG. 1A). The lines 110, 112, 114 and 116 (FIG. 1A) are bundled as cables 202. Each cable goes to a respective receiver 204. The concern of skewing remains since within each cable 204 the separate metal lines have differing thickness which results in skewing of the data.

SUMMARY OF THE INVENTION

The system described herein provides a minimized skew generator that has very small timing variation. Four phase signals are compressed into one signal including the four phase information. Therefore, the signal with all of the phase information travels on the same line, thus avoiding the concerns of skewing based on different sizes of metal lines. Since there are two rising edges and two falling edges within one signal, an enable line is utilized to select between the first and second, rising and falling edges. With this processing, the system has only one critical signal output, thus requiring only one signal line. Skewing of the signals and the amount of power required are both reduced.

In one aspect, a system for minimizing timing skew comprises one or more clock pulse generators for generating a four phase clock signal, a single clock signal line coupled to the one or more clock pulse generators for receiving and delivering the four phase clock signal, one or more enable pulse generators for generating a four phase enable signal and an enable signal line coupled to the one or more enable pulse generators for receiving and delivering the four phase enable signal. The four phase clock signal comprises a first rising edge, a second rising edge, a first falling edge and a second falling edge in one cycle. The first rising edge contains 0 degree information and the second rising edge contains 180 degree information. The first falling edge contains 90 degree information and the second falling edge contains 270 degree information. The four phase enable signal is used to distinguish the first rising edge and the second rising edge. A latch is used to distinguish the first falling edge and the second falling edge. The one or more clock pulse generators comprise a 0 degree pulse generator for generating a first pulse that triggers a first transistor; a 90 degree pulse generator for generating a second pulse that triggers a second transistor; a 180 degree pulse generator for generating a third pulse that triggers a third transistor; and a 270 degree pulse generator for generating a fourth pulse that triggers a fourth transistor. The one or more enable pulse generators comprise a 90 degree pulse generator for generating a fifth pulse that triggers a fifth transistor and a 270 degree pulse generator for generating a sixth pulse that triggers a sixth transistor. The enable signal contains two transitions in one cycle.

In another aspect, a system for minimizing timing skew comprises one or more clock pulse generators for generating a four phase clock signal, one or more enable pulse generators for generating a four phase enable signal, a pair of lines for carrying the four phase clock signal and the four phase enable signal, a first driver for driving the four phase clock signal coupled to one line of the pair of lines and a second driver for driving the four phase enable signal coupled to the other line of the pair of lines. The four phase clock signal comprises a first rising edge, a second rising edge, a first falling edge and a second falling edge in one cycle. The first rising edge contains 0 degree information and the second rising edge contains 180 degree information. The first falling edge contains 90 degree information and the second falling edge contains 270 degree information. The four phase enable signal is used to distinguish the first rising edge and the second rising edge. A latch is used to distinguish the first falling edge and the second falling edge. The one or more clock pulse generators comprise a 0 degree pulse generator for generating a first pulse that triggers a first transistor; a 90 degree pulse generator for generating a second pulse that triggers a second transistor; a 180 degree pulse generator for generating a third pulse that triggers a third transistor; and a 270 degree pulse generator for generating a fourth pulse that triggers a fourth transistor. The one or more enable pulse generators comprise a 90 degree pulse generator for generating a fifth pulse that triggers a fifth transistor and a 270 degree pulse generator for generating a sixth pulse that triggers a sixth transistor. The four phase enable signal contains two transitions in one cycle.

In yet another aspect, a method of minimizing skew comprises compressing four phase clock signals into one compressed four phase clock signal, generating a four phase enable signal and delivering the one compressed four phase clock signal on a single clock signal line and the four phase enable signal on an enable signal line to one or more receivers. The one compressed four phase signal comprises a first rising edge, a second rising edge, a first falling edge and a second falling edge in one cycle. The first rising edge contains 0 degree information and the second rising edge contains 180 degree The first falling edge contains 90 degree information and the second falling edge contains 270 degree information. The four phase enable signal is used to distinguish the first rising edge and the second rising edge. A latch is used to distinguish the first falling edge and the second falling edge. The four phase enable signal contains two transitions in one cycle.

DETAILED DESCRIPTION OF THE PREFERRED EMBODIMENT

A minimized skew generator for semiconductors is described herein. More specifically, the minimized skew generator is for Double Data Rate (DDR) memory with a center-aligned scheme such as high speed Static Random Access Memory (SRAM) or Synchronized Dynamic RAM (SDRAM). Delayed Lock Loop (DLL) signals are four-phase (0/90/180/270 degree) signals. As discussed above, when memory chip density is increased, the output of DLL signals are run a long way to a receiver. Thus, when there are irregularities in the height and width of a material and critical dimension bias, the prior art versions which use four independent metal wires possibly have large variations or skews between each signal.

A system using one critical signal, and thus one signal line for critical data is described herein. In addition to the one critical signal, there is a non-critical signal which is a four-phase enable signal. The enable signal distinguishes the information of 0 degree, 180 degree, 90 degree, 270 degree signals because both the 0 degree and 180 degree signals are rising edge and both the 90 degree and 270 degree signals are falling edge.

Figure 1A:
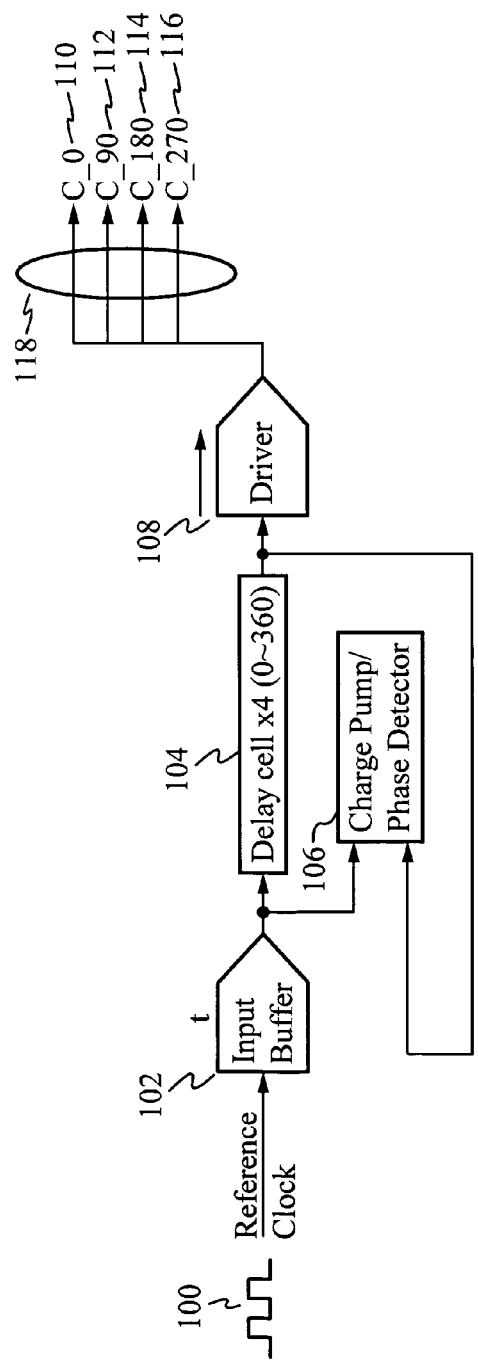
FIG. 1A illustrates a block diagram of a delayed lock loop of prior art.
Figure 1B:
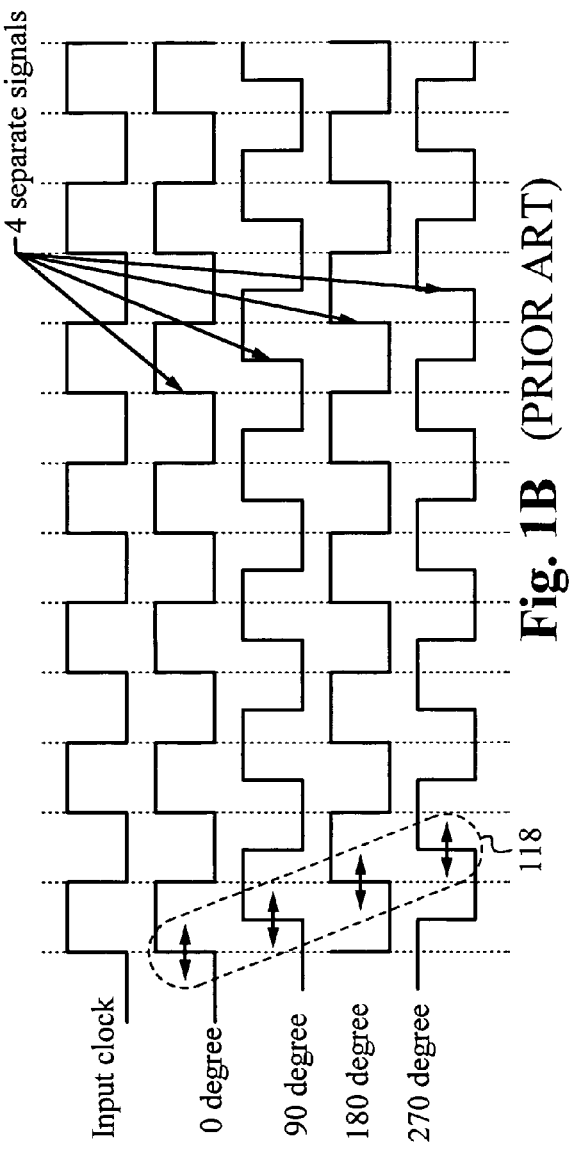
FIG. 1B illustrates a timing diagram of prior art.
Figure 2:
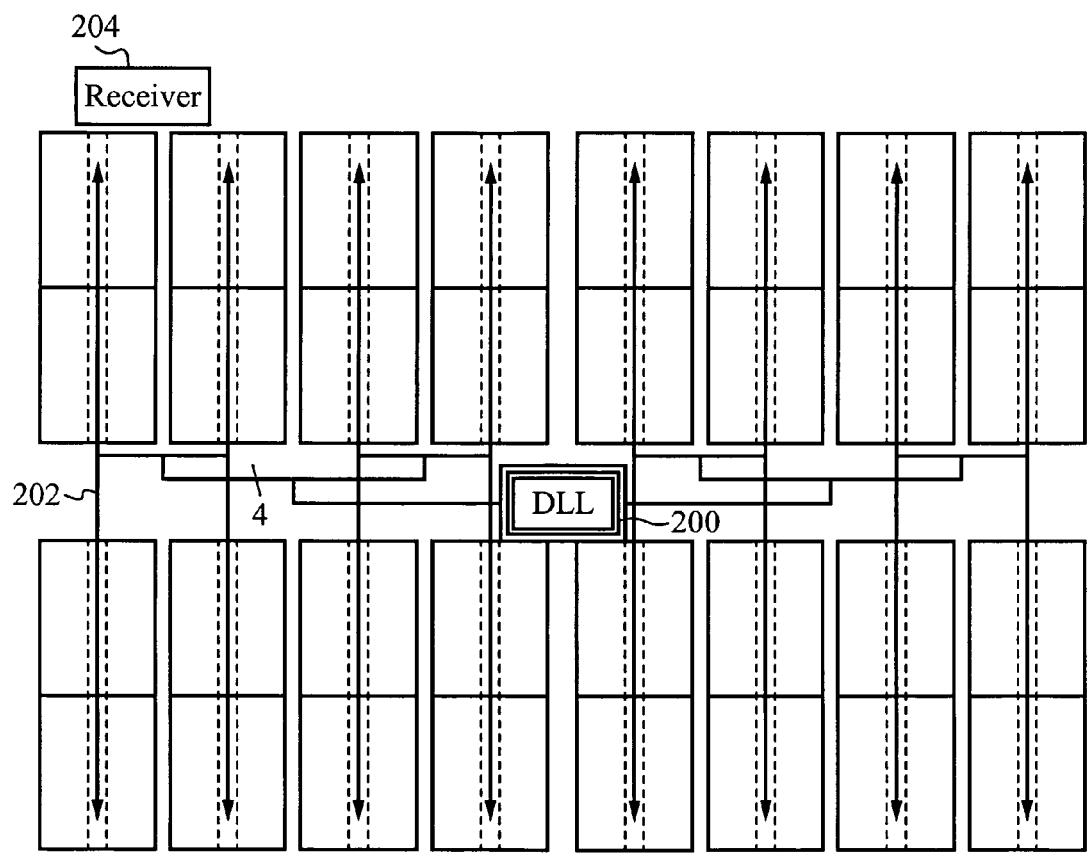
FIG. 2 illustrates an example of an internal view of a memory.
Figure 3:
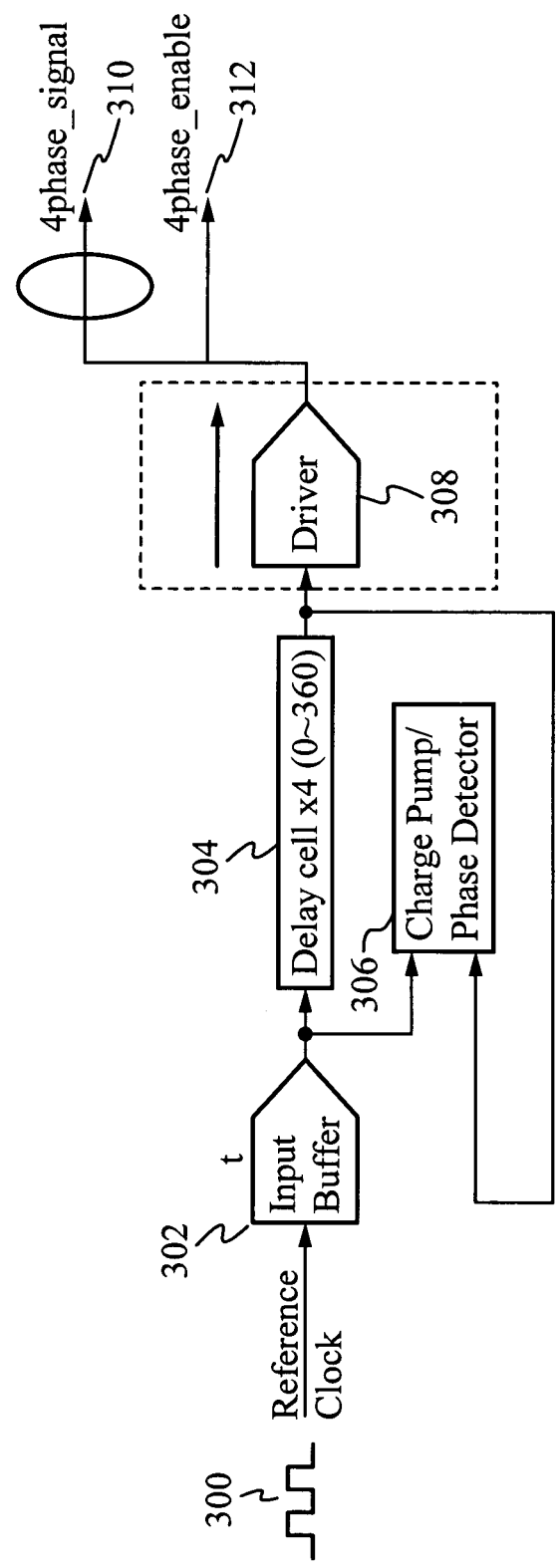
FIG. 3 illustrates a block diagram of a delayed lock loop.

FIG. 3 illustrates a block diagram of a delayed lock loop with one signal line 310 and one phase enable line 312. A reference clock signal 300 is received at an input buffer 302. The input buffer 302 stores data signals including the clock signal 300 temporarily. After a time t, the input buffer sends the data to the delay cells 304 and a charge pump/phase detector 306. The delay cells 304 delay the input clock signals as needed. The charge pump/phase detector 306 compares the phase of a local oscillator (not shown) with the reference clock signal 300. The charge pump/phase detector 306 also ensures that the local oscillator (not shown) stays in the same frequency as the reference clock signal 300 by delivering positive or negative charge pulses depending on whether the reference clock signal 300 leads or lags the local oscillator (not shown). The delay cells 304 and the charge pump/phase detector 306 function together to ensure the signals have the correct phase and frequency. A driver 308 then receives the modified signals and drives the signals to the phase signal line 310. The driver 308 combines the four separate phase signals into one, so that they only utilize one signal line instead of four separate ones, thus minimizing skew. The phase enable line 312 is utilized to select a signal from the combined signals. In contrast to the system described herein, the prior art sends four independent signals that use 0 degree and 180 degree signals for catching output data and 90 degree and 270 degree signals for catching the output clock, which has eight transitions in one cycle. The system described herein has four transitions in one cycle.

Figure 4:
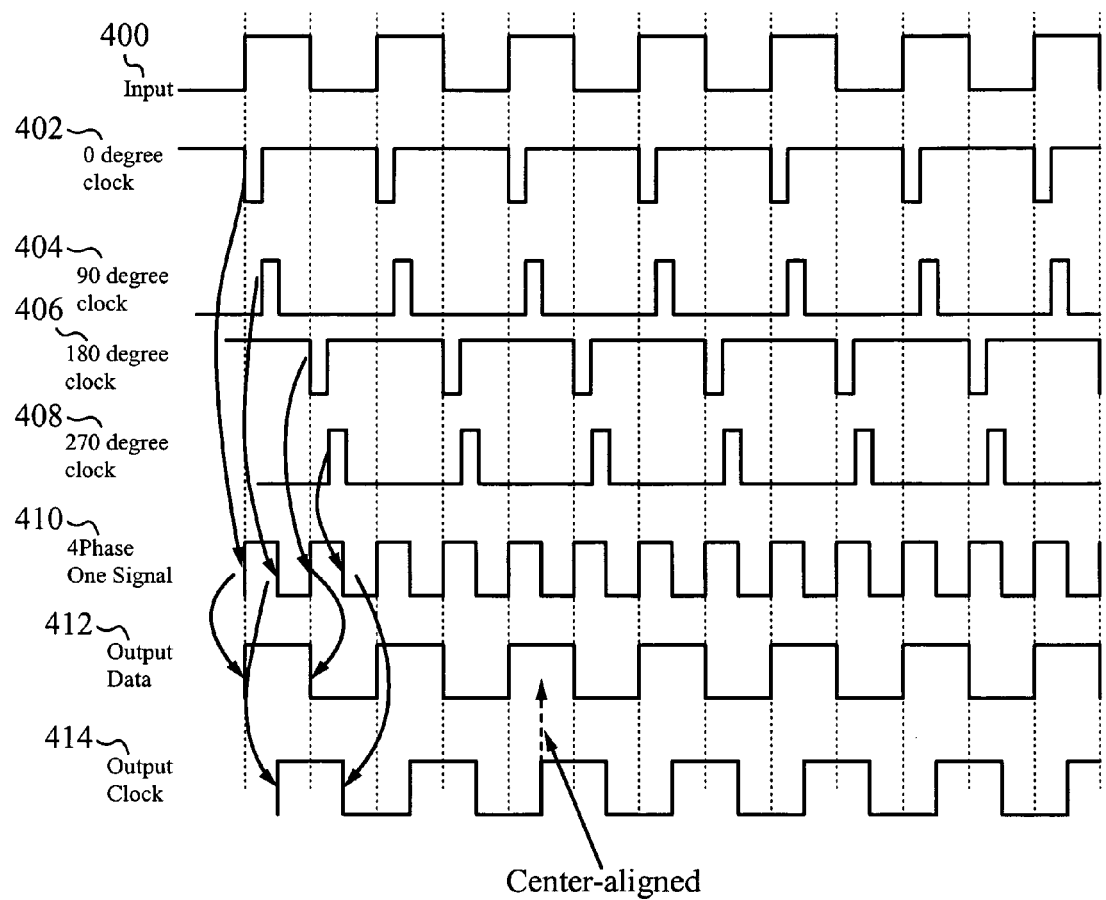
FIG. 4 illustrates a timing diagram of a compressed phase signal.

FIG. 4 illustrates a timing diagram of a compressed phase signal. An input signal 400 is shown. A 0 degree clock signal 402 has a falling edge which becomes the first rising edge of a four phase clock signal 410. A 90 degree clock signal 404 has a rising edge which becomes the first falling edge of the four phase clock signal 410. A 180 degree clock signal 406 has a falling edge which becomes the second rising edge of the four phase clock signal 410. A 270 degree clock signal 408 has a rising edge which becomes the second falling edge of the four phase clock signal 410. Thus, all four different phase clocks 402, 404, 406 and 408 are combined into one four phase clock signal 410. Upon reaching a receiver for the clock, the four phase clock signal 410 results in an output data signal 412 and an output clock signal 414.

Figure 5:
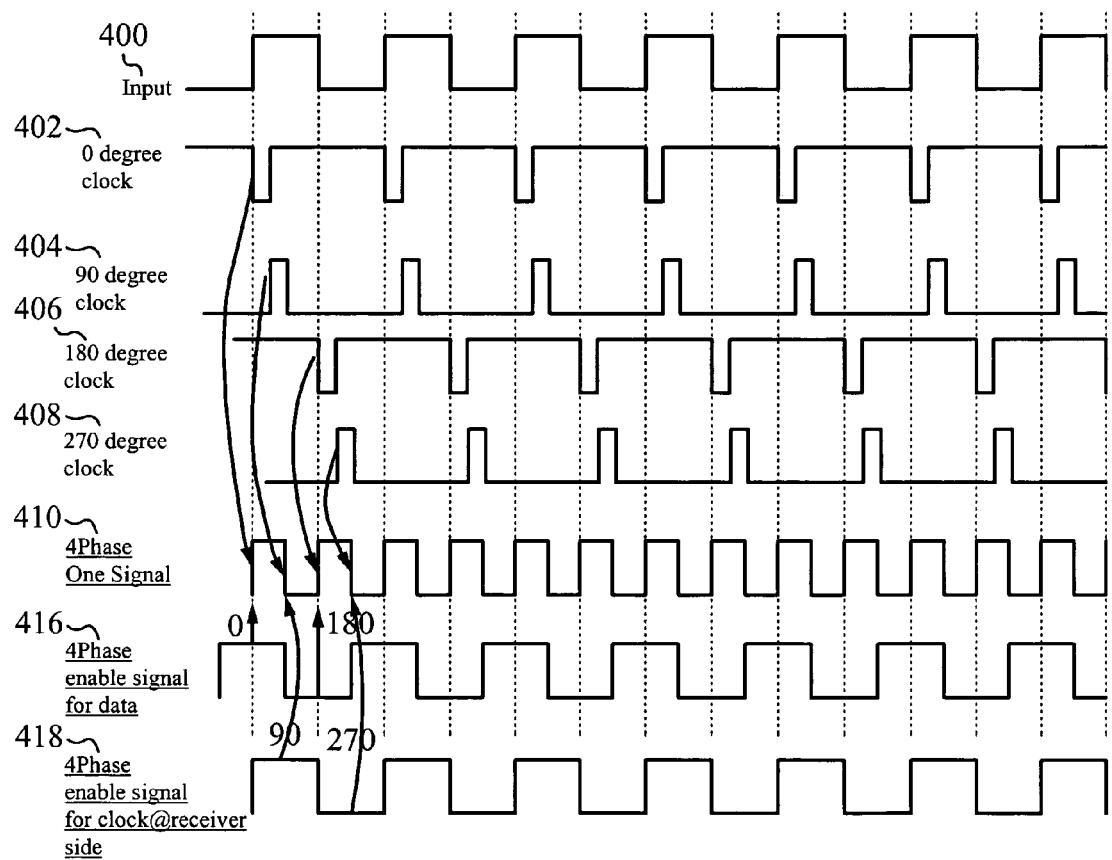
FIG. 5 illustrates a timing diagram of a compressed phase enable signal.

FIG. 5 illustrates a timing diagram of a compressed phase enable signal. As described above, the four different phase clock signals 402, 404, 406 and 408 are combined into the one four phase clock signal 410. A four phase enable signal 416 is utilized to indicate the proper phase within the four phase signal since there are two rising edges and two falling edges with different phase information. When the four phase enable signal 416 is high for the rising edge of the four phase signal 410, the output is the 0 degree signal. When the four phase enable signal at the receiver side 418 is high for the falling edge of the four phase signal 410, the output is the 90 degree signal. When the four phase enable signal 416 is low for the rising edge of the four phase signal 410, the output is the 180 degree signal. When the four phase enable signal at the receiver side 418 is low for the falling edge of the four phase signal 410, the output is the 270 degree signal.

Figure 6:
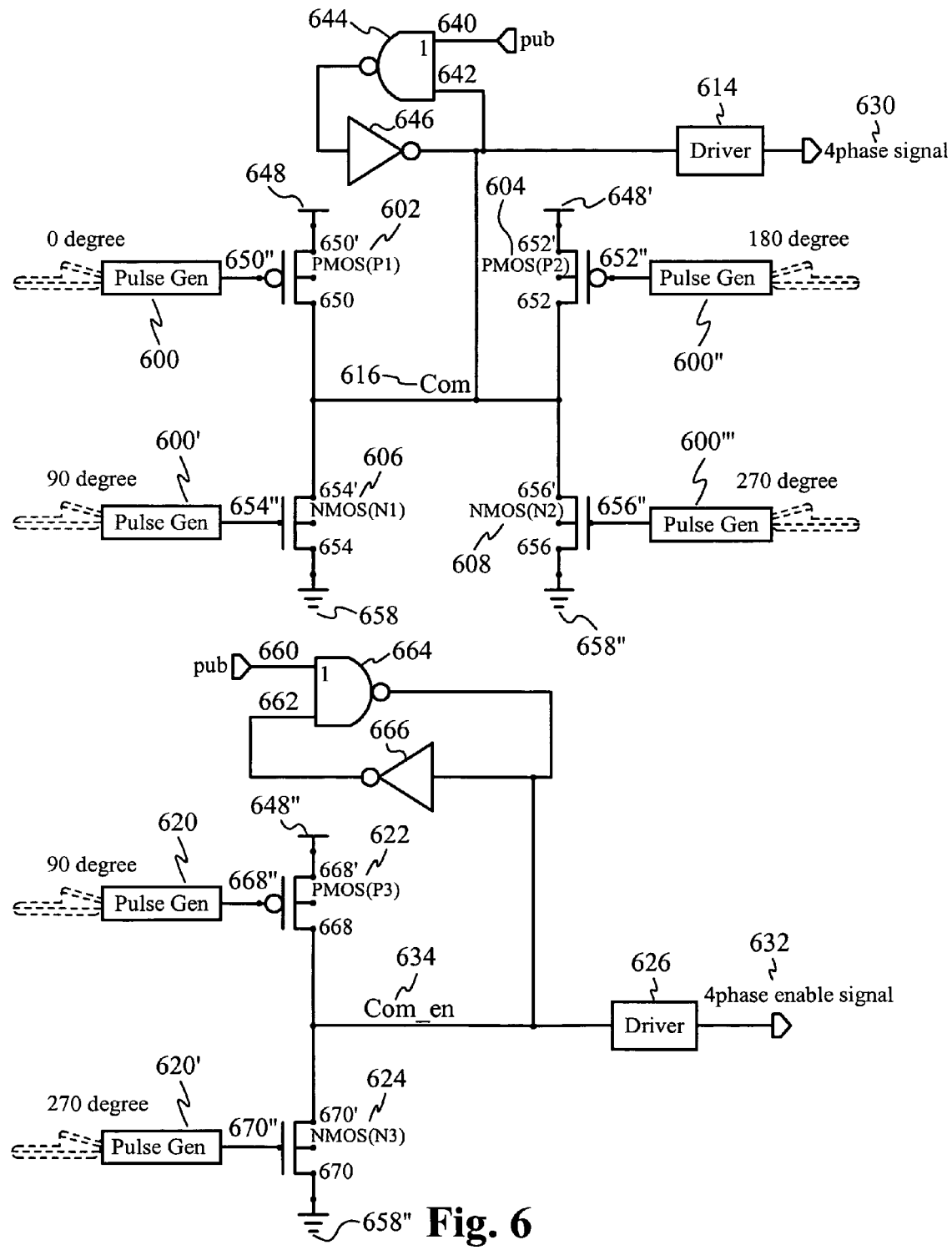
FIG. 6 illustrates a circuit diagram of a compressed four phase signal generator and a four phase enable signal generator.

FIG. 6 illustrates a circuit diagram of a compressed four phase signal generator and a four phase enable signal generator. In the four phase signal generator, a Nand gate 644 receives an input pub as its first input 640. The output of the Nand gate 644 is the input of an inverter 646. The second input 642 of the Nand gate 644 receives the output of the inverter 646. The output of the inverter 646 is coupled with a Com node 616 and a driver 614. A 0 degree pulse generator 600 is coupled to the gate 650" of a Positive-channel Metal-Oxide Semiconductor (PMOS) transistor P1 602. The source 650' of the PMOS transistor P1 602 is coupled to the voltage Vcc 648. The drain 650 of the PMOS transistor P1 602 is coupled to the Com node 616. A 90 degree pulse generator 600' is coupled to the gate 654" of a Negative-channel Metal-Oxide Semiconductor (NMOS) transistor N1 606. The drain 654' of the NMOS transistor N1 606 is coupled to the Com node 616 and to the drain of the PMOS transistor P1 602. The source 654 of the NMOS transistor N1 606 is coupled to ground 658. A 180 degree pulse generator 600" is coupled to the gate 652" of a PMOS transistor P2 604. The source 652' of the PMOS transistor P2 604 is coupled to the voltage Vcc 648'. The drain 652 of the PMOS transistor P2 604 is coupled to the Com node 616 and to the drain of the PMOS transistor P2 604. A 270 degree pulse generator 600'" is coupled to the gate 656" of an NMOS transistor N2 608. The drain 656' of the NMOS transistor N2 608 is coupled to the Com node 616 and to the drain of the PMOS transistor P2 604. The source 656 of the NMOS transistor N2 608 is coupled to ground 658'. A driver 614 is coupled to the Com node 616 to drive the four phase clock signal 630.

In the four phase enable signal generator, a Nand gate 664 receives an input pub as its first input 660. The output of the Nand gate 664 is the input of an inverter 666. The second input 662 of the Nand gate 664 receives the output of the inverter 666. The output of the Nand gate 664 is also coupled to the Com_en node 634 and the driver 626. A 90 degree pulse generator 620 is coupled to the gate 668" of a PMOS transistor P3 622. The source 668' of the PMOS transistor P3 622 is coupled to the voltage Vcc 648'. The drain 668 of the PMOS transistor P3 622 is coupled to the Com_en node 634. A 270 degree pulse generator 620' is coupled to the gate 670" of an NMOS transistor N3 624. The drain 670' of the NMOS transistor N3 624 is coupled to the Com_en node 634 and to the drain of the PMOS transistor P3 622. The source 670 of the NMOS transistor N3 624 is coupled to ground 658". A driver 626 is coupled to the Com_en node 634 to drive the four phase enable signal 632.

Based on the output of a 0 degree signal from the DLL circuit, the pulse generator 600 generates a negative pulse that triggers on the PMOS transistor P1 602. A voltage of a Com node 616 goes to high by turning the PMOS transistor P1 602 on. Based on the output of the 90 degree signal from the DLL circuit, the pulse generator 600' generates a positive pulse that triggers on the NMOS transistor N1 606. A voltage of the Com node 616 goes to low by turning the NMOS transistor N1 606 on. Based on the output of the 180 degree signal from the DLL circuit, the pulse generator 600" generates a negative pulse that triggers on the PMOS transistor P2 604. A voltage of the Com node 616 goes to high by turning the PMOS transistor P2 604 on. Based on the output of the 270 degree signal from the DLL circuit, the pulse generator 600'" generates a positive pulse that triggers on the NMOS transistor N2 608. A voltage of the Com node 616 goes to low by turning the NMOS transistor N2 608 on. Through this processing, the four phase clock signal 630 is generated as illustrated in the timing diagram of FIG. 4. To distinguish the 0 degree from the 180 degree phase and the 90 degree from the 270 degree phase, the four phase enable signal is utilized.

Based on the output of a 90 degree signal from the DLL circuit, a negative pulse is generated by a pulse generator 620 that triggers on the PMOS transistor P3 622. A voltage of the Com_en node 634 goes to high by turning the PMOS transistor P3 622 on. Based on the output of the 270 degree signal from the DLL circuit, a positive pulse is generated by a pulse generator 620' that triggers on the NMOS transistor N3 624. A voltage of the Com_en node 634 goes to low by turning the NMOS transistor N3 624 on. Through this processing, a four phase enable signal 632 is generated.

Figure 7:
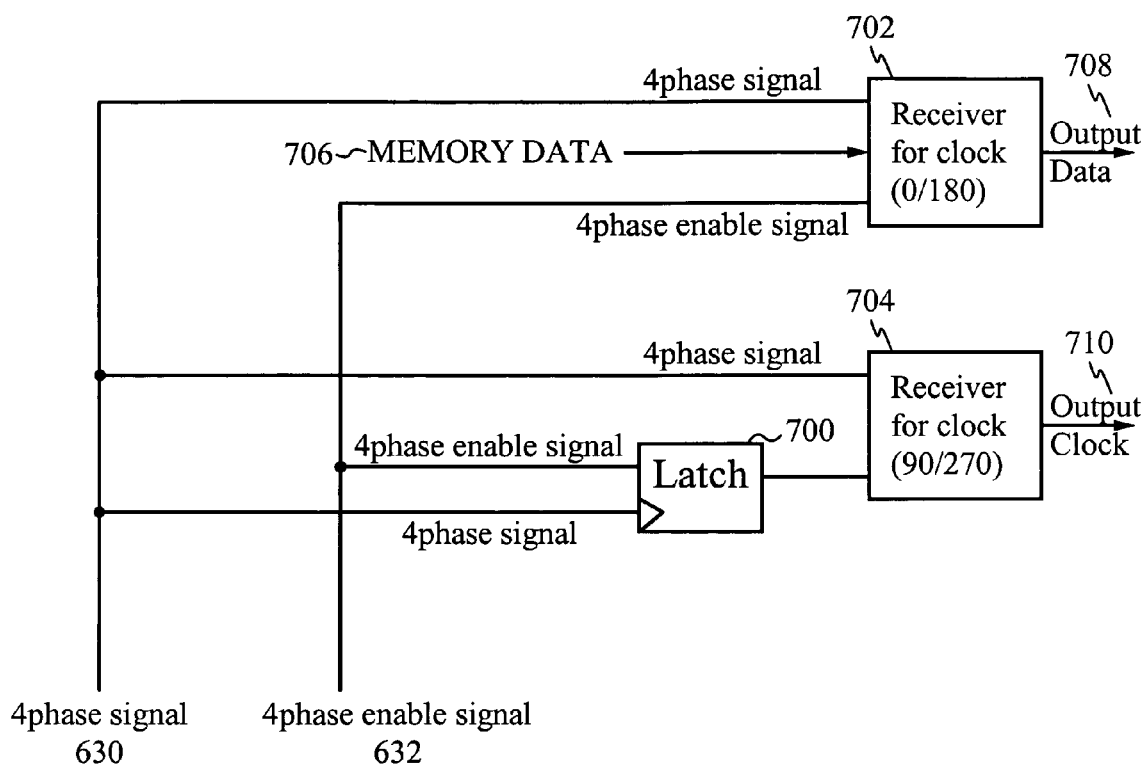
FIG. 7 illustrates a circuit diagram of output of the compressed four phase signal generator.

FIG. 7 illustrates a circuit diagram of the output of the compressed four phase clock signal generator. A first receiver 702 receives the four phase clock signal 630 and the four phase enable signal 632 for clock phases of 0 degrees and 180 degrees. Memory data 706 is received at the first receiver 702. A second receiver 704 for clock phases of 90 degrees and 270 degrees is coupled to a latch 700. The second receiver 704 receives the four phase clock signal 630 and the output from the latch 700. The latch 700 has the four phase clock signal 630 as its clock and a four phase enable signal 632 as input data. The output of the latch 700 goes to high at 0 degree information of the four phase clock signal 630 and goes to low at 180 degree information of the four phase clock signal 630. The first receiver 702 produces an output data 708, and the second receiver produces an output clock 710.

The system described herein provides a minimized skew generator that has very small timing variation. Four phase clock signals are compressed into one signal which thus has four phase information. The four phase clock information is compressed using push-pull transistor schemes. Simulation results as seen in Table 1 show approximately 76% reduction of skew and 48% reduction of power needed. In one cycle, there are only four transitions instead of eight, as in the prior art. This results in a significant reduction in power requirements. Furthermore, only two metal lines are required instead of four. This simplifies and reduces the necessary circuitry. As described above, the 0 degree signal from the DLL generates the negative pulse that triggers the PMOS transistor gate voltage and generates the first rising edge of the four phase signal. The 90 degree signal from the DLL generates the positive pulse that triggers the NMOS transistor gate voltage and generates the first falling edge of the four phase signal. The 180 degree signal from the DLL generates the negative pulse that triggers the PMOS transistor gate voltage and generates the second rising edge of the four phase signal. The 270 degree signal from the DLL generates the positive pulse that triggers the PMOS transistor gate voltage and generates the second rising edge of the four phase signal. With this processing, the system described has only one critical signal output compared to four critical signal outputs, within systems of the prior art.

TABLE 1

Improvements of the system described herein over the prior art.

|  | Prior Art | Compressed System | Improvement (%) |
|---|---|---|---|
| Skew | ~210 ps | ~50 ps | 76% Reduction |
| Power | 1490 uA | 774 uA | 48% Reduction |

To utilize the system described herein, pulse generators for 0 degrees, 90 degrees, 180 degrees and 270 degrees function in conjunction with PMOS transistors and NMOS transistors to generate the four phase clock signal and the four phase enable signal. Once all four phases are contained within one signal, only one line is required to transmit the four phase clock signal. A second line is utilized to transmit the four phase enable signal. The four phase clock signal and the four phase enable signal are sent to a receiver for the clock, and result in output data and an output clock.

In operation, the system described herein only sends one critical signal, which is a compressed four phase clock signal. The compressed four phase clock signal results from compressing 0 degree, 90 degree, 180 degree and 270 degree clock signals into one signal. In addition to the critical signal, one non-critical four phase clock enable signal is sent to distinguish the 0 degree and 180 degree or 90 degree and 270 degree signals. The four phase enable signal is not a critical signal because it has a i quarter cycle (tCK/4) margin reference to the four phase clock signal. Since all of the phase information is carried within the same signal on one line, concerns of timing skew are greatly minimized.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A system for minimizing timing skew comprising:
one or more clock pulse generators for generating a four phase clock signal;
a single clock signal line coupled to the one or more clock pulse generators for receiving and delivering the four phase clock signal;
one or more enable pulse generators for generating a four phase enable signal; and
a single enable signal line coupled to the one or more enable pulse generators for receiving and delivering the four phase enable signal.

2. The system as claimed in claim 1 wherein the four phase clock signal comprises a first rising edge, a second rising edge, a first falling edge and a second falling edge in one cycle.

3. The system as claimed in claim 2 wherein the first rising edge contains 0 degree information and the second rising edge contains 180 degree information.

4. The system as claimed in claim 2 wherein the first falling edge contains 90degree information and the second falling edge contains 270 degree information.

5. The system as claimed in claim 2 further comprising a receiver coupled to the single clock signal line to receive the four phase clock signal and coupled to the single enable signal line to receive the four phase enable signal, wherein the receiver is configured to apply the four phase enable signal to distinguish the first rising edge from the second rising edge.

6. The system as claimed in claim 2 wherein a latch is used to distinguish the first falling edge and the second falling edge.

7. The system as claimed in claim 1 wherein the one or more clock pulse generators comprise a 0 degree pulse generator for generating a first pulse that triggers a first transistor; a 90 degree pulse generator for generating a second pulse that triggers a second transistor; a 180 degree pulse generator for generating a third pulse that triggers a third transistor;
and a 270 degree pulse generator for generating a fourth pulse that triggers a fourth transistor.

8. The system as claimed in claim 7 wherein the one or more enable pulse generators comprise a 90 degree pulse generator for generating a fifth pulse that triggers a fifth transistor and a 270 degree pulse generator for generating a sixth pulse that triggers a sixth transistor.

9. The system as claimed in claim 1 wherein the four phase enable signal contains two transitions in one cycle.

10. A system for minimizing timing skew comprising:
one or more clock pulse generators for generating a four phase clock signal;
one or more enable pulse generators for generating a four phase enable signal;
a single clock signal line for carrying the four phase clock signal and a single enable signal line for carrying the four phase enable signal;
a first driver for driving the four phase clock signal coupled to the single clock signal line; and
a second driver for driving the four phase enable signal coupled to the single enable signal line.

11. The system as claimed in claim 10 wherein the four phase clock signal comprises a first rising edge, a second rising edge, a first falling edge and a second falling edge in one cycle.

12. The system as claimed in claim 11 wherein the first rising edge contains 0 degree information and the second rising edge contains 180 degree information.

13. The system as claimed in claim 11 wherein the first falling edge contains 90 degree information and the second falling edge contains 270 degree information.

14. The system as claimed in claim 11 further comprising a receiver coupled to the single clock signal line to receive the four phase clock signal and coupled to the single enable signal line to receive the four phase enable signal, wherein the receiver is configured to apply the four phase enable signal to distinguish the first rising edge from the second rising edge.

15. The system as claimed in claim 11 wherein a latch is used to distinguish the first falling edge and the second falling edge.

16. The system as claimed in claim 11 wherein the one or more clock pulse generators comprise a 0 degree pulse generator for generating a first pulse that triggers a first transistor; a 90 degree pulse generator for generating a second pulse that triggers a second transistor; a 180 degree pulse generator for generating a third pulse that triggers a third transistor;
and a 270 degree pulse generator for generating a fourth pulse that triggers a fourth transistor.

17. The system as claimed in claim 16 wherein the one or more enable pulse generators comprise a 90 degree pulse generator for generating a fifth pulse that triggers a fifth transistor and a 270 degree pulse generator for generating a sixth pulse that triggers a sixth transistor.

18. The system as claimed in claim 10 wherein the four phase enable signal contains two transitions in one cycle.

19. A method of minimizing skew comprising:
compressing four phase clock signals into one compressed four phase clock signal;
generating a four phase enable signal; and
delivering the one compressed four phase clock signal on a single clock signal line and the four phase enable signal on a single enable signal line to one or more receivers.

20. The method as claimed in claim 19 wherein the one compressed four phase signal comprises a first rising edge, a second rising edge, a first falling edge and a second falling edge in one cycle.

21. The method as claimed in claim 20 wherein the first rising edge contains 0 degree information and the second rising edge contains 180 degree information.

22. The method as claimed in claim 20 wherein the first falling edge contains 90 degree information and the second falling edge contains 270 degree information.

23. The method as claimed in claim 20 wherein the four phase enable signal is used to distinguish the first rising edge and the second rising edge.

24. The method as claimed in claim 20 wherein a latch is used to distinguish the first falling edge and the second falling edge.

25. The method as claimed in claim 19 wherein the four phase enable signal contains two transitions in one cycle.

26. A system for minimizing timing skew comprising:
a clock pulse generator for generating a four phase clock signal comprising a first rising edge, a second rising edge, a first falling edge and a second falling edge in one cycle;
a single clock signal line coupled to the clock pulse generator for receiving and delivering the four phase clock signal;
an enable pulse generator for generating a four phase enable signal which contains two transitions in one cycle and is used to distinguish the first falling edge and the second falling edge; and
a single enable signal line coupled to the enable pulse generator for receiving and delivering the four phase enable signal.

27. A method of minimizing skew comprising:
compressing four phase clock signals into one compressed four phase clock signal comprising a first rising edge, a second rising edge, a first falling edge and a second falling edge in one cycle;
generating a four phase enable signal which contains two transitions in one cycle and is used to distinguish the first falling edge and the second falling edge; and
delivering the one compressed four phase clock signal on a single clock signal line and the four phase enable signal on a single enable signal line to one or more receivers.

28. A system for minimizing timing skew comprising:
one or more clock pulse generators for generating a four phase clock signal;
a single clock signal line coupled to the one or more clock pulse generators for receiving and delivering the four phase clock signal;
one or more enable pulse generators for generating a four phase enable signal;
a single enable signal line coupled to the one or more enable pulse generators for receiving and delivering the four phase enable signal; and
a receiver coupled to the single clock signal line to receive the four phase clock signal and coupled to the single enable signal line to receive the four phase enable signal;
wherein the receiver applies the four phase enable signal to distinguish the first rising edge from the second rising edge.

29. The system as claimed in claim 28 wherein the four phase clock signal comprises a first rising edge, a second rising edge, a first falling edge and a second falling edge in one cycle.

30. The system as claimed in claim 29 wherein the first rising edge contains 0 degree information and the second rising edge contains 180 degree information.

31. The system as claimed in claim 29 wherein the first falling edge contains 90 degree information and the second falling edge contains 270 degree information.

32. The system as claimed in claim 29 wherein a latch is used to distinguish the first falling edge and the second falling edge.

33. The system as claimed in claim 28 wherein the four phase enable signal contains two transitions in one cycle.

34. A system for minimizing timing skew comprising:
one or more clock pulse generators for generating a four phase clock signal;
one or more enable pulse generators for generating a four phase enable signal;
a single clock signal line for carrying the four phase clock signal and a single enable signal line for carrying the four phase enable signal;
a first driver for driving the four phase clock signal coupled to the single clock signal line;
a second driver for driving the four phase enable signal coupled to the single enable signal line; and
a receiver coupled to the single clock signal line to receive the four phase clock signal and coupled to the single enable signal line to receive the four phase enable signal;
wherein the receiver applies the four phase enable signal to distinguish the first rising edge from the second rising edge.

35. The system as claimed in claim 34 wherein the four phase clock signal comprises a first rising edge, a second rising edge, a first falling edge and a second falling edge in one cycle.

36. The system as claimed in claim 35 wherein the first rising edge contains 0 degree information and the second rising edge contains 180 degree information.

37. The system as claimed in claim 35 wherein the first falling edge contains 90 degree information and the second falling edge contains 270 degree information.

38. The system as claimed in claim 35 wherein a latch is used to distinguish the first falling edge and the second falling edge.

39. The system as claimed in claim 34 wherein the four phase enable signal contains two transitions in one cycle.

* * * * *